United States Patent [19]

Farrow

[11] 4,191,995
[45] Mar. 4, 1980

[54] DIGITAL AUTOMATIC GAIN CONTROL CIRCUIT

[75] Inventor: Cecil W. Farrow, Highlands, N.J.

[73] Assignee: Bell Telephone Laboratories, Incorporated, Murray Hill, N.J.

[21] Appl. No.: 5

[22] Filed: Jan. 2, 1979

[51] Int. Cl.$^2$ .............................................. G06F 15/46
[52] U.S. Cl. .................................. 364/113; 307/264; 328/168
[58] Field of Search ..... 340/347 M, 347 AD, 15 GC; 307/264; 328/168, 169; 364/113

[56] References Cited

U.S. PATENT DOCUMENTS

| | | | |
|---|---|---|---|
| 3,394,315 | 7/1968 | Gray | 325/404 |
| 3,683,367 | 8/1972 | Monroe et al. | 340/347 AD |
| 3,887,875 | 6/1975 | Shearer et al. | 328/168 |
| 3,981,005 | 9/1976 | Takayama et al. | 340/347 AD |
| 4,052,598 | 10/1977 | Turner et al. | 364/113 |

*Primary Examiner*—Thomas J. Sloyan
*Attorney, Agent, or Firm*—Thomas Stafford

[57] ABSTRACT

A digital automatic gain control (AGC) circuit in a digital communication receiver generates a gain adjusted output signal (104) having nominally constant output power by controllably attenuating an input signal (101). Attenuation is accomplished by employing a coarse analog attenuator (106, 107) and a fine digital attenuator (108) under control of a digital control circuit (60). Attenuation adjustments to the analog attenuator (106, 107) alone perturb the gain adjusted output signal (104) causing processing errors in the digital receiver. The digital attenuator (108) is controllably adjusted, in a predetermined manner, to minimize the number of subsequent adjustments made to the analog attenuator (106, 107) following a first adjustment. Adjusting the digital attenuator to a prescribed intermediate attenuation setting ($G_O$) between predetermined maximum and minimum attenuation settings ($T_{HI}, T_{LO}$) for the digital attenuator (108) counteracts the effect of a simultaneous attenuation adjustment to the analog attenuator (106, 107) and also substantially reduces the likelihood of subsequent analog attenuator adjustments. This minimizes perturbations in the gain adjusted output signal (104) and processing errors in the digital receiver.

10 Claims, 9 Drawing Figures

DIGITAL AUTOMATIC GAIN CONTROL CIRCUIT

TECHNICAL FIELD

This invention relates to digital communications systems and, more specifically, to the automatic control of received signal levels in digital receivers.

BACKGROUND OF THE INVENTION

In communication systems, noise and other phenomena of the transmission medium can cause variations in the power of the received signal. Automatic gain control (AGC) circuits respond to this received signal to generate a gain adjusted output signal having nominally constant average power. During operation, the AGC constrains the amplitude of the gain adjusted output signal to a predetermined amplitude range. Many communication systems rely on the utilization of the entire amplitude range to achieve efficient performance. Receiver systems incorporate an AGC to provide the capability for fully utilizing the amplitude range. Illustratively, an AGC attenuates a received signal whose amplitude is outside of the range, thereby, constraining the received signal to the amplitude range. As the received signal decreases in power the AGC decreases the attenuation applied to the received signal proportionally to allow for a fuller utilization of the amplitudes range.

Many circuits are known which automatically adjust the amplitude of a received signal in order to generate a gain adjusted output signal having nominally constant average power. For the most part, these circuits are completely analog and increase in complexity as the need for precision increases. Increased complexity is also directly reflected in increased costs. Digital implementation of the automatic gain control circuit utilizing medium-scale integrated logic is a desirable approach for overcoming the above-mentioned limitation of the prior art.

One prior known AGC arrangement which is implemented by employing digital circuit techniques is disclosed in U.S. Pat. No. 3,981,005 issued to J. Takayama et al. on Sept. 14, 1976. Takayama et al. employ a digital up/down counter and associated threshold control logic elements to control the attenuation applied to the received signal. Specifically, when the amplitude of the received signal is above a predetermined maximum amplitude, the counter is incremented to cause a step increase in the attenuation applied to the received signal. The counter is decremented to cause a step decrease in the attenuation applied to the received signal when the amplitude of the received signal is below a predetermined minimum amplitude. The maximum amount of attenuation which can be applied to a received signal depends on the step size of each attenuation adjustment and the total number of attenuation steps. In the Takayama et al. arrangement, the total number of attenuation steps is related to the number of stages in the up/down counter. A fundamental limitation of the Takayama et al. arrangement is that the attenuator uses large steps of attenuation in order to provide a wide dynamic attenuation range. Reducing the step size of each attenuation adjustment does not overcome this limitation since it reduces the dynamic attenuation range, i.e., the total amount of attenuation which can be applied to the received signal.

One digital AGC which overcomes some of the limitations of the prior Takayama et al. arrangement is disclosed in U.S. Pat. No. 4,052,598 issued to R. J. Turner et al. on Oct. 4, 1977. In the Turner et al. arrangement, the attenuation function is divided between two attenuators controlled by the same control signal. By dividing the attenuator in this manner, Turner et al. provide the capability for rapidly changing the amplitude of the gain adjusted signal.

A problem common to these prior known digital AGC arrangements is the perturbation of the gain adjusted signal caused by one or several attenuation adjustments. Attenuation adjustments are made in response to variations or oscillations of the received signal. When a received signal level exceeds a predetermined upper limit or threshold, for example, the attenuation is increased by a fixed amount or step. Such a step change in attenuation causes small signal perturbations or "glitches" to occur on the gain adjusted signal. Glitches are a source of errors for a system of which the digital AGC is a part. As the received signal level exceeds the upper threshold or drops below a lower threshold more frequently, the occurrence of glitches in the gain adjusted signal increases proportionally. In turn, this increases the probability of error in further processing of the gain adjusted signal in, for example, a data system.

SUMMARY OF THE INVENTION

The problem of increased occurrence of glitches and other problems of known prior digital AGC arrangements are overcome in accordance with the principles of the invention to be described herein by employing a first variable attenuator and a second variable attenuator in conjunction with a digital control circuit for controllably adjusting the attenuation settings of both attenuators. Attenuation levels are controlled so that step adjustments in the attenuation setting of the first attenuator are simultaneously counteracted by step adjustments in the attenuation settings of the second attenuator. Specifically, the attenuation setting of the second attenuator is adjusted by a prescribed amount to a setting between a predetermined maximum and minimum setting for the second attenuator. In so doing, the likelihood of oscillations or the like in the received signal causing subsequent attenuation adjustments and glitches is substantially eliminated. Therefore, the probability of error in further processing of the gain adjusted output signal is decreased.

In one embodiment, the first variable attenuator is an analog attenuator adjustable in coarse attenuation step changes. An output signal from the first attenuator is converted to digital form and supplied to the second variable attenuator. A digital attenuator adjustable in incrementally fine attenuation step changes is employed as the second variable attenuator. In steady state, the digital AGC controls the varying received signal by making small incremental attenuation adjustments to the digital attenuator.

In another aspect of the invention, digital implementation of a combination of coarse and fine attenuation adjustments increases the precision of the attenuators without a need for high precision network elements.

In still another aspect of the invention, certain control levels are preset either statically or dynamically based upon a particular application. These presettable levels include: the reference power level of the digital AGC; the upper and lower threshold limits in the digital control; the time constants of a first and second filter used in the digital control circuit; and the predetermined level to which the digital attenuator is set following a threshold crossing.

BRIEF DESCRIPTION OF THE DRAWING

These and other objects and advantages of the invention will be more fully understood by considering the illustrative embodiments now to be described in detail in conjunction with the accompanying drawings, in which.

DETAILED DESCRIPTION

Figure 1:
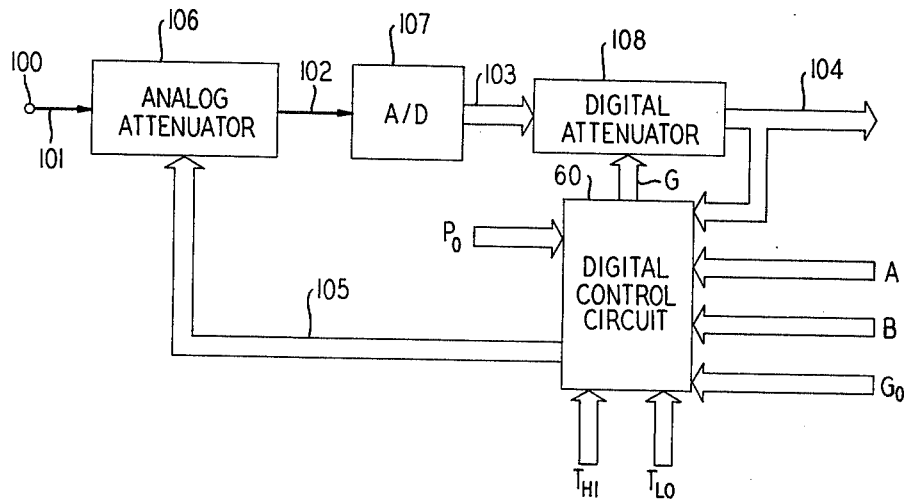
FIG. 1 shows in block schematic form one embodiment of the invention for automatically controlling the level of received signals.

FIG. 1 is a simplified block diagram of one embodiment of the instant invention for automatically generating a gain adjusted output signal having nominally constant output power. Accordingly, received signals are supplied via input terminal 100.

The convention for differentiating between analog and digital signals in FIG. 1 through FIG. 6 and, consequently, in the detailed description is almost uniformly adhered to throughout the figures with exceptions noted in the description. Digital signals are designated by double-lined arrows, e.g., signal 105, and analog signals are designated by single-lined arrows, e.g., signal 102. Unless otherwise indicated in this description, all digital signals are assumed to be m lead signals and all registers are assumed to be capable of storing at least m bits. The variable m is usually related to the degree of accuracy required by digital control circuit 60 and by the remaining digital system of which the digital AGC is a part.

Analog attenuator 106 responds to a first control signal, i.e., analog attenuator setting signal 105, to maintain the received signal input level within prescribed limits for most variations of received input signal 101. These limits are usually designed to restrict received signal 101 to the conversion range of analog-to-digital converter (A/D) 107. Attenuation adjustments within analog attenuator 106 are made in response to signal 105.

FIG. 1 further shows a A/D 107 which generates attenuated digital signal 103, a digital representation of analog attenuated output signal 102, in accordance with conventional practice.

Attenuated digital signal 103 from A/D 107 is supplied to digital attenuator 108 which operates in accordance with one aspect of the invention to make incrementally fine amplitude adjustments on signal 103 in response to a second control signal, i.e., digital attenuator setting signal G. Digital attenuator 108 generates gain adjusted output signal 104 as the digital AGC output. An m×m bit digital multiplier is preferably employed as digital attenuator 108. In an example from experimental practice, a linear multiplier is employed as digital attenuator 108 to attenuate signal 103 over a range from 0 dB to 6 dB in incrementally small step changes which are less than 0.01 dB per step. The linear multiplier simply forms the product of the two input signals, i.e., attenuated digital signal 103 and digital attenuator setting signal G. Other types of multipliers, for example, an exponential multiplier, could be employed equally well. This type of multiplier is effective when, for instance, signal G is substantially equal to logG rather than G. In this example, an exponential multiplier converts the multiplier input signal from logG to G and proceeds with the multiplication as in the linear multiplier to produce gain adjusted output signal 104.

Digital control circuit 60 in response to gain adjusted output signal 104 and reference signals $G_O, T_{HI}, T_{LO}, P_O, A$, and B generates analog attenuator setting signal 105, in accordance with one aspect of the invention, for controlling an increase or decrease in the attenuation setting of analog attenuator 106. Concurrently, digital control circuit 60 also generates digital attenuator setting signal G, in accordance with an aspect of the invention, for controlling a decrease or increase in the attenuation setting of digital attenuator 108.

Digital control circuit 60 controls simultaneously the attenuation settings of both analog attenuator 106 and digital attenuator 108. The overall control scheme is viewed as an increase or decrease of the attenuation setting of analog attenuator 106 with a simultaneous counteractive decrease or increase of the attenuation setting of digital attenuator 108. At this point, the attenuation setting of digital attenuator 108 is a prescribed intermediate setting between maximum and minimum settings for digital attenuator 108. If the attenuation changes in each attenuator, as just described, are of equal magnitudes, then the net attenuation change for the digital AGC is 0 dB. Since glitches occur from step changes in attenuation in analog attenuator 106, an attenuation change in digital attenuator 108 simultaneous with and counteractive to the attenuation change in analog attenuator 106 reduces the noticeable effect of the step change in analog attenuator 106. Therefore, the likelihood of glitches occurring is substantially reduced. Where the step changes in each attenuator are not equal, the residue from the inequality may cause a glitch. But, the magnitude of that glitch is significantly lower than the magnitude of the glitch generated by an attenuation step change in analog attenuator 106 alone.

Figure 2:
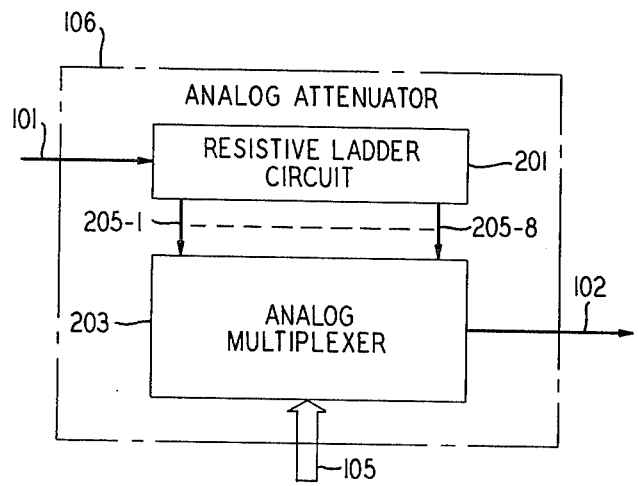
FIG. 2 shows in block schematic form details of the analog attenuator employed in the embodiment of the invention shown in FIG. 1.

Arrangements for analog attenuator 106 known in the prior art are capable of operating as recited above. However, most prior arrangements are realized by employing a majority of discrete component circuit arrangements. In the instant embodiment, integrated circuit arrangements are preferably employed to perform the necessary circuit functions. One arrangement which may be used for attenuator 106 is shown in FIG. 2 discussed below. Resistive ladder circuit 201, in this instance, generates eight attenuated signals 205-1 through 205-8 from received input signal 101. The dynamic range of attenuation applied to received signal 101 by ladder circuit 201 is 0 dB to 21 dB. Each of the eight attenuated signals differs in absolute value by approximately 3 dB from the next contiguous attenuated signal. Attenuated signals 205-1 through 205-8 and signal 105 are applied to multiplexer 203. Such multiplexers are readily available commercially, for example, RCA CD4051 which is a COS/MOS single 8-channel analog multiplexer/demultiplexer. Multiplexer 203, in response to signal 105, selects the appropriate attenuated signal at the multiplexer channel. The selected signal is transmitted as analog attenuator output signal 102. In an example from experimental practice, when multiplexer 203 control input, i.e., signal 105, is binary 111, received input signal 101 is attenuated by 0 dB. Since attenuated signal 205-8, corresponding to 0 dB attenuation is situated at channel 8, a binary 111 for signal 105 causes attenuated signal 205-8 to be transmitted as output signal 102. Similarly, when multiplexer 203 control input, i.e., signal 105, is binary 000, received input signal 105 is attenuated by 21 dB. Since attenuated signal 205-1, corresponding to 21 dB attenuation, is situated at channel 1, a binary 000 for signal 105 causes attenuated signal 205-1 to be transmitted as output signal 102. Table I defines one set of exemplary relationships between 3-bit multiplexer control input, i.e., signal 105 and the corresponding attenuation selected.

TABLE I

| MULTIPLEXER CONTROL INPUT | ANALOG ATTENUATION |
| --- | --- |
| 000 | 21dB |
| 001 | 18dB |
| 010 | 15dB |
| 011 | 12dB |
| 100 | 9dB |
| 101 | 6dB |
| 110 | 3dB |
| 111 | 0dB |

Figure 3:
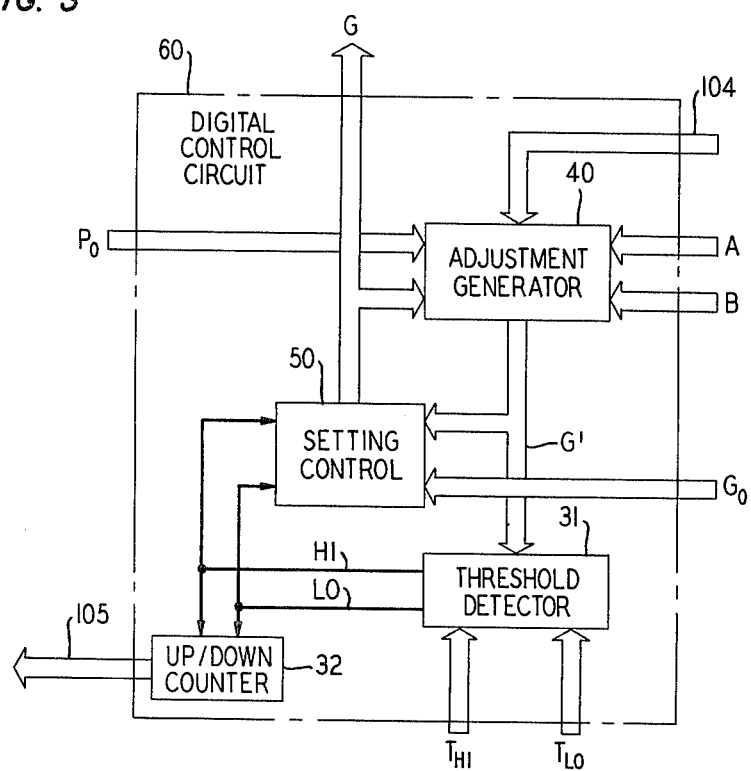
FIG. 3 shows in block schematic form details of one arrangement for the digital control circuit employed in the embodiment of the invention shown in FIG. 1.
Figure 4:
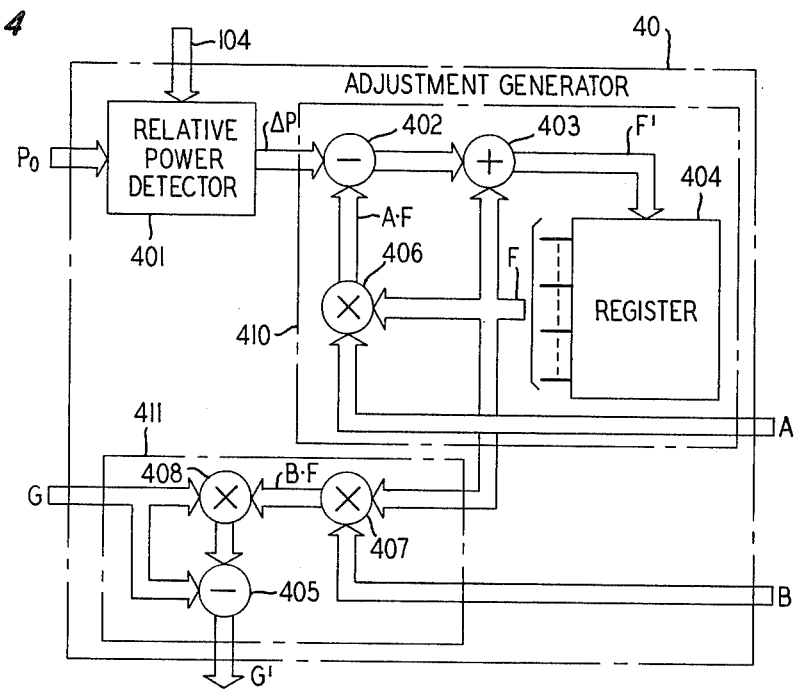
FIG. 4 shows in block schematic form details of an embodiment of the adjustment generator employed in the digital control circuit shown in FIG. 3.

Details of digital control circuit 60 are shown in FIG. 3. Gain adjusted output signal 104 and digital attenuator setting signal G are both supplied to adjustment generator 40. Adjustment generator 40 combines these signals with reference signals $P_O$, A and B in a prescribed manner to produce attenuator adjustment signal G'. By extracting certain information contained in gain adjusted output signal 104, adjustment generator 40 generates signal G' which is an estimate of the amount of attenuation adjustment necessary to be made on digital attenuator 108. Signal G', however, is not directly applied to digital attenuator 108. Attenuation adjustment signal G' is checked to see that the attenuation change represented by signal G' does not raise digital attenuator 108 above its maximum attenuation setting or lower digital attenuator 108 below its minimum attenuation setting. Details of adjustment generator 40 are shown in FIG. 4 discussed below.

Attenuator adjustment signal G' is supplied to threshold detector 31 to insure that the amplitude of signal G' is within certain prescribed threshold limits. Upper and lower threshold limits are set in threshold detector 31 by threshold limit signals $T_{HI}$ and $T_{LO}$, respectively. Lower threshold limit signal $T_{LO}$ represents the minimum attenuation setting for digital attenuator 108 and upper threshold limit signal $T_{HI}$ represents the maximum attenuation setting for digital attenuator 108. Threshold detector 31 generates attenuation control signals HI and LO in response to signal G'. If signal G' is within the limits prescribed by signals $T_{HI}$ and $T_{LO}$, neither attenuation control signal HI nor LO is activated. When adjustment signal G' crosses upper threshold $T_{HI}$, control signal HI is activated. Similarly, when adjustment signal G' crosses lower threshold $T_{LO}$, control signal LO is activated. In an example from experimental practice, HI and LO are binary signals wherein the inactive condition is a binary 0 signal and the active condition is a binary 1 signal.

Setting control 50 is responsive to signal G', both attenuation control signals HI and LO, and reference signal $G_O$ for generating digital attenuator setting signal G. Signal G adjusts the attenuation setting of digital attenuator 108. The range of amplitude levels for signal G is constrained by setting control 50 to be within limits specified by threshold limit signals $T_{HI}$ and $T_{LO}$. Setting control 50 maintains control over the amplitude of signal G by insuring that, upon occurrence of either threshold crossed, the amplitude of signal G is set, in accordance with an aspect of the invention, to a predetermined intermediate level between threshold limits $T_{HI}$ and $T_{LO}$. When no threshold crossing is detected by threshold detector 31, setting control 50 sets signal G to the amplitude of signal G' in digital form.

Up/down counter 32 responds to both attenuation control signals HI and LO, and generates analog attenuator setting signal 105. Although an up/down counter is preferred for generating first control signal 105 any other known arrangement could be substituted. When signal HI is a binary 1 representing the active state, counter 32 is incremented by one unit. An active signal HI indicates that upper threshold limit $T_{HI}$ has been crossed by signal G'. Specifically, this indicates that the attenuation applied by analog attenuator 106 is excessive causing signal 101 to be "over-attenuated". After counter 32 has been incremented, signal 105 decreases the attenuation setting of analog attenuator 106—as shown in Table I—by approximately 3 dB. An active signal LO, indicative of signal G' crossing lower threshold limit $T_{LO}$, causes counter 32 to be decremented by one unit. In this case, the active signal LO indicates that analog attenuator 106 is applying insufficient attenuation to received input signal 101. This causes signal 104 to be "under-attenuated". After counter 32 has been decremented, signal 105 increases the attenuation setting of analog attenuator 106 by approximately 3 dB. In an example from experimental practice, counter 32 is a 3-bit counter and is inhibited from "overflowing" or "underflowing". Overflow is the condition wherein a counter in its maximum count state, binary 111 in this example, is incremented by one unit producing the minimum count state, binary 000. Underflow is the complementary relation of overflow, i.e., when the counter is in its minimum count state, binary 000, a one unit decrement produces the maximum count of binary 111.

Details of adjustment generator 40 are shown in FIG. 4. Adjustment generator 40 comprises relative power detector 401, first filter 410 and second filter 411. Relative power detector 401 is an arrangement for generating an output signal ΔP corresponding substantially to the instantaneous power in signal 104 relative to the power in second input signal, $P_O$. Signal ΔP corresponds to the square of gain adjustment output signal 104 diminished by reference signal $P_O$, where the amplitude of signal $P_O$ is constrained to be in the range of amplitudes between 0 and 1. In an example from experimental practice, signal $P_O$ represents a reference power level of approximately −15 dB. Signal ΔP is commonly referred to as an error signal.

Relative power detector 401 is realized by employing a digital multiplier to square gain adjustment output signal 104 and by employing a digital subtractor to subtract signal $P_O$ from the multiplier output signal. Alternatively, a table look-up arrangement is employed as relative power detector 401. In such a table look-up arrangement, signal 104 addresses a particular location in the table containing the appropriate ΔP signal amplitude for a given signal $P_O$ and the particular amplitude of signal 104. Digital embodiments of the table look-up are preferably realized through the use of a read only memory (ROM).

First filter 410 comprises digital subtractor 402, digital adder 403, register 404, and digital multiplier 406. In response to error signal ΔP and reference signal A, filter 410 generates output signal F, which is a smoothed version of error signal ΔP. Reference signal A controls the time constant of filter 410, thereby regulating the effect that signal ΔP can have on signal F. For small amplitudes of signal A, filter 410 has a longer time constant than for larger amplitudes for signal A. Typically, signal A has a small enough amplitude, e.g., 1/16, to allow filter 410 to smooth sudden fluctuations in error signal ΔP.

In subtractor 402, signal A·F is subtracted from error signal ΔP. The output signal from subtractor 402 is added to signal F in adder 403 thereby generating output signal F'. Signal F' is stored in register 404. Output signal F is generated by register 404 in response to signal F'. Digital multiplier 406 in resonse to signal F and reference signal A generates signal A·F.

The function of filter 410 can be reduced to the form shown in Equation (1) as:

$$F = \Delta P + F(1-A), \quad 0 < A < 1. \tag{1}$$

A preferred condition in the operation of the digital AGC is that register 404 be initialized to zero. In effect, this condition insures a stable initial operation of the digital AGC. More particularly, the initial condition insures that filter 410 initially reacts only to error signal ΔP rather than to spurious noise in filter 410.

Second filter 411 comprises digital multipliers 407 and 408 and digital subtractor 405. Multiplier 407, in response to reference signal B and signal F, generates product signal B·F. Signal B·F is then multiplied by signal G in multiplier 408 generating an output signal. The output signal from multiplier 408 is subsequently subtracted from signal G in subtractor 405 to produce attenuator adjustment signal G'.

The function of filter 411 is stated in Equation (2) as:

$$G' = G(1-(B\cdot F)), \quad 0 < B < 1. \tag{2}$$

Another more simplified embodiment of filter 411 may be accomplished by advantageously applying certain principles to the function in Equation (2). For example, taking a logarithm of both sides of Equation (2) yields:

$$\log G' = \log G + \log(1-(B\cdot F)), \quad 0 < B < 1. \tag{3}$$

In steady state operation of the digital AGC, error signal ΔP and consequently signal F approach zero. Thus, for amplitudes of product signal B·F reasonably small, $\log(1-B\cdot F)$ is approximated by $-B\cdot F$ resulting in, $$\log G' \approx \log G - (B\cdot F), \quad 0 < B < 1 \text{ and } B\cdot F << 1. \tag{4}$$

The function in Equation (4) is advantageously utilized to obtain a more simplified arrangement for adjustment generator 40 in that multiplier 408 can be eliminated. In addition, this simplification is realized by employing an exponential multiplier or the like, depending on the base chosen for the logarithm, as digital attenuator 108. It should also be noted that the logarithm, i.e., log G, is taken over any convenient base, e.g., base 2.

Figure 5:
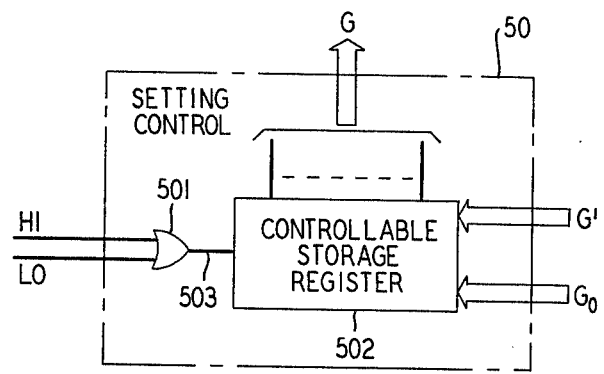
FIG. 5 shows in block schematic form details of an embodiment of the setting control employed in the digital control circuit shown in FIG. 3.

Setting control 50, shown in detail in FIG. 5, comprises OR gate 501 and controllable storage register 502. OR gate 501 is responsive to attenuation control signals LO and HI. Output signal 503 from OR gate 501 is a binary signal. Signal 503 is a binary 1 when either signal HI or LO is a binary 1 to indicate that signal G' has crossed a threshold limit in threshold detector 31 (FIG. 3). For signals HI and LO both being binary 0, signal 503 is a binary 0 indicating that signal G' is within prescribed threshold limits $T_{HI}$ and $T_{LO}$. Controllable storage register 502, in response to signal 503, reference signal $G_O$ and attenuator adjustment signal G', generates digital attenuator setting signal G. When signal 503 indicates that signal G' is within prescribed threshold limits $T_{HI}$ and $T_{LO}$, signal G' is stored in controllable storage register 502. Alternatively, when signal 503 indicates that either threshold limit $T_{HI}$ or $T_{LO}$ has been crossed, signal $G_O$ is stored in controllable storage register 502. Signal $G_O$ has an amplitude which is between upper threshold limit $T_{HI}$ and lower threshold limit $T_{LO}$. In an example from experimental practice, the amplitude of signal $G_O$ is the geometric mean of the amplitudes of threshold limit signals $T_{HI}$ and $T_{LO}$. For values of $T_{HI} = 1$ and $T_{LO} = \frac{1}{2}$, the amplitude of signal $G_O$ is $\sqrt{2}/2$. It is important to note in this example that $G_O$ is designed to have a value 3 dB from each threshold. This insures that, following a threshold crossing, digital attenuator setting signal G is within the range of attenuation settings for digital attenuator 108. Also, the likelihood of subsequent threshold crossings by signal G' is substantially reduced, thereby minimizing the possibility of glitches occurring. Hence, the probability of error in further processing of signal 104 is decreased.

Figure 6:
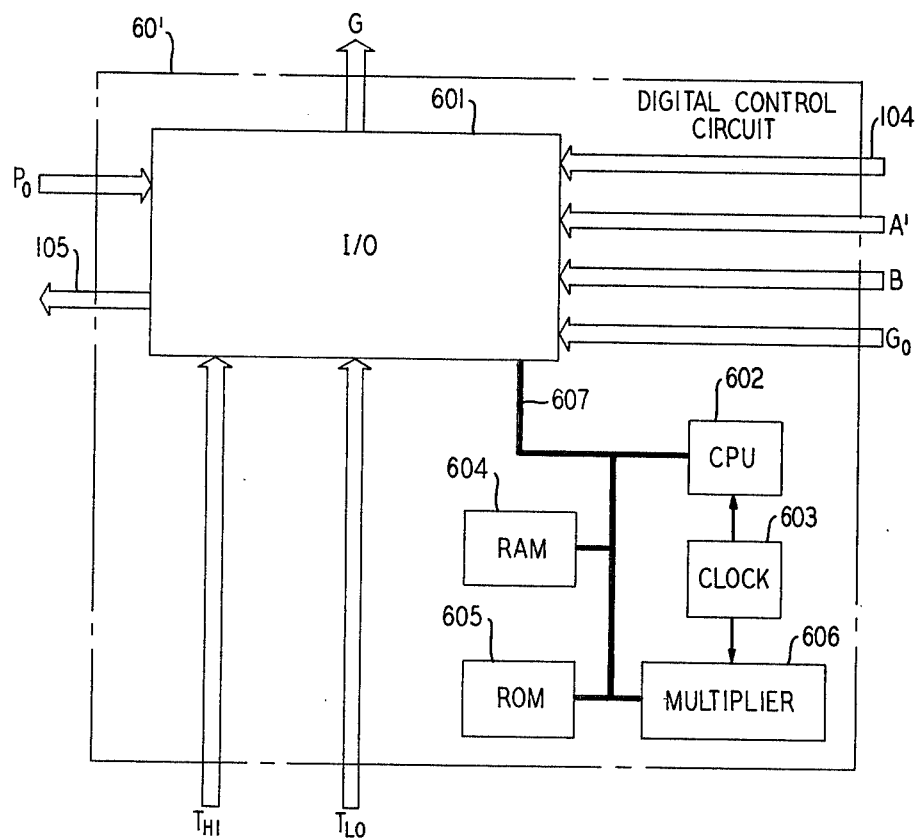
FIG. 6 shows in block schematic form details of another arrangement for the digital control circuit employed in the embodiment of the invention in FIG. 1.

FIG. 6 shows in block diagram form details of digital control 60'. Digital control circuit 60' is an alternative embodiment of digital control circuit 60 (FIG. 1) and is isomorphic to digital control circuit 60 (FIGS. 1 and 3) in an overall functional sense. Accordingly, shown are input/output (I/O) 601, central processor unit (CPU) 602, clock circuit 603, read-write memory commonly referred to as random access memory (RAM) 604, read-only memory (ROM) 605 and multiplier 606. CPU 602, RAM 604, ROM 605 and I/O 601 are interconnected via bus 607 to form a so-called microcomputer system. Multiplier 606 is interconnected with the microcomputer system in a peripheral sense via bus 607. Incorporating multiplier 606 in digital control circuit 60' preserves the identity of digital control circuit 60' as a microcomputer system. Clock 603 supplies timing signals to CPU 602 and multiplier 606. Any of several arrangements now commercially available may be employed to realize the desired implementation of digital control circuit 60'. In an example from experimental practice, an Advanced Micro Devices, Inc. AM 2901 4-Bit Microprocessor Slice CPU, a TRW 12×12 bit parallel LSI multiplier MPY-12AJ, and associated circuit elements have been employed. The AM 2901 and its operation and programming are described in "AM 2900 Bipolar Microprocessor Family", 1976. The TRW multiplier and its operation are described in a TRW application note on "LSI Multipliers: N×N Bit Parallel Multipliers", Mar. 1977.

Multiplier 606 includes a plurality of working registers which are employed in the practice of the invention. Specifically, input registers X and Y and output register P are utilized. CPU 602 also includes a plurality of working registers, nine of which are used in the practice of the invention, namely, registers 1, 2, 3, 4, 5, 6, 7, 10 and 11. Scratch registers are used for the temporary storage of results from different operations. These registers may be located in either CPU 602 or RAM 604. The digital control circuit routine described below is stored in ROM 605.

Operation of digital control circuit 60' in controlling analog attenuator 106 and digital attenuator 108 in accordance with an aspect of the invention, is described in the digital program listing shown in the Appendix. This program listing, written in an assembly language for the AM 2901, is a description of the set of electrical control signals which serve to reconfigure digital control circuit 60' into a machine capable of controlling analog and digital attenuators 106 and 108, respectively, of FIG. 1 in accordance with an aspect of the invention. As previously stated, an AM 2901 assembly language which has been modified is used in the program listing in the Appendix. Modifications have been made primarily to the format for listing instructions and not to be substance of the AM 2901 assembly language instructions. Documentary comments have been provided with the program listing as an aid to better understanding.

Figure 7:
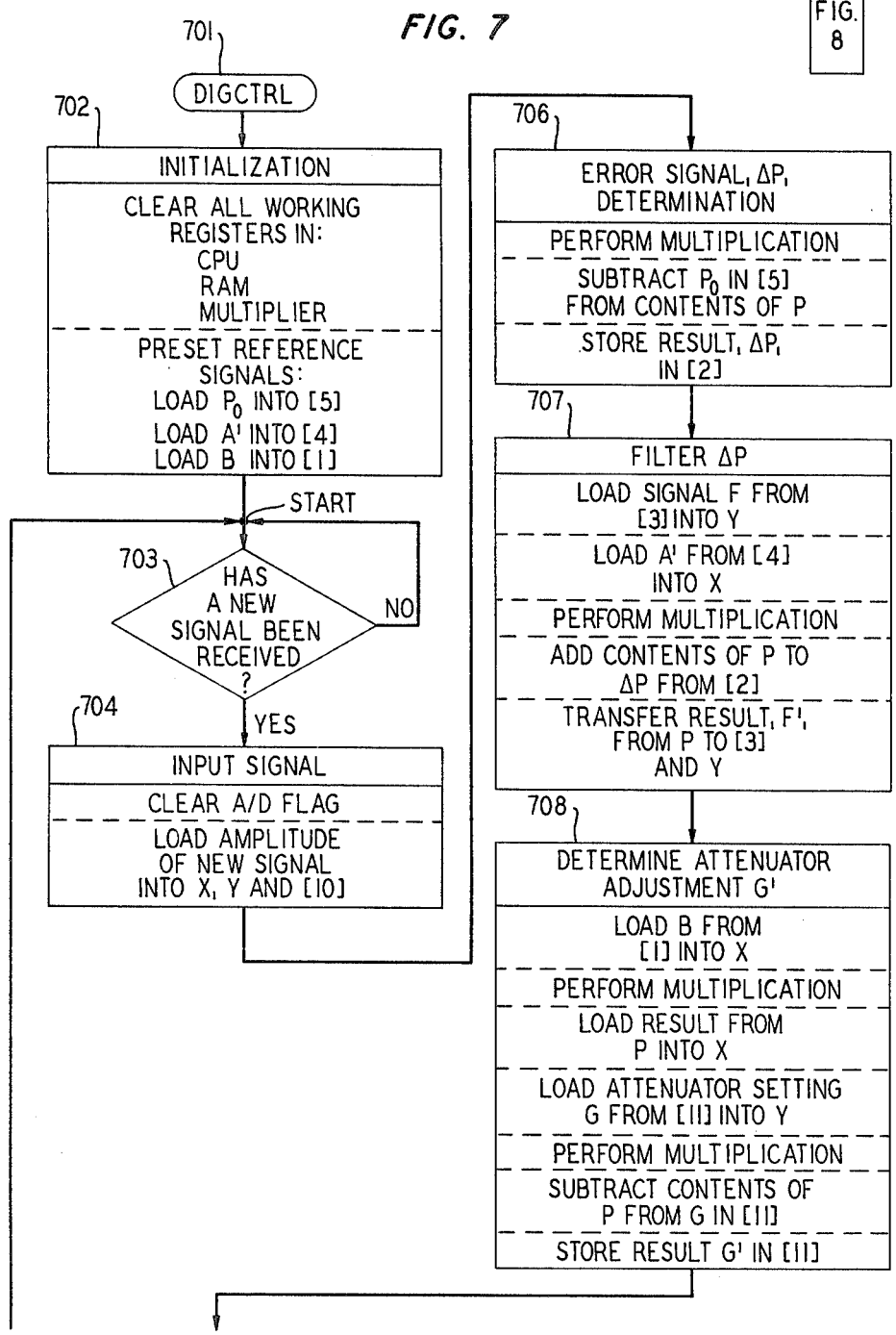
FIGS. 7 and 8 when combined as shown in FIG. 9 are a flowchart which illustrates the steps in accordance with an aspect of the invention for automatically generating a gain adjusted output signal utilizing the embodiment of the invention shown in FIG. 1.
Figure 8:
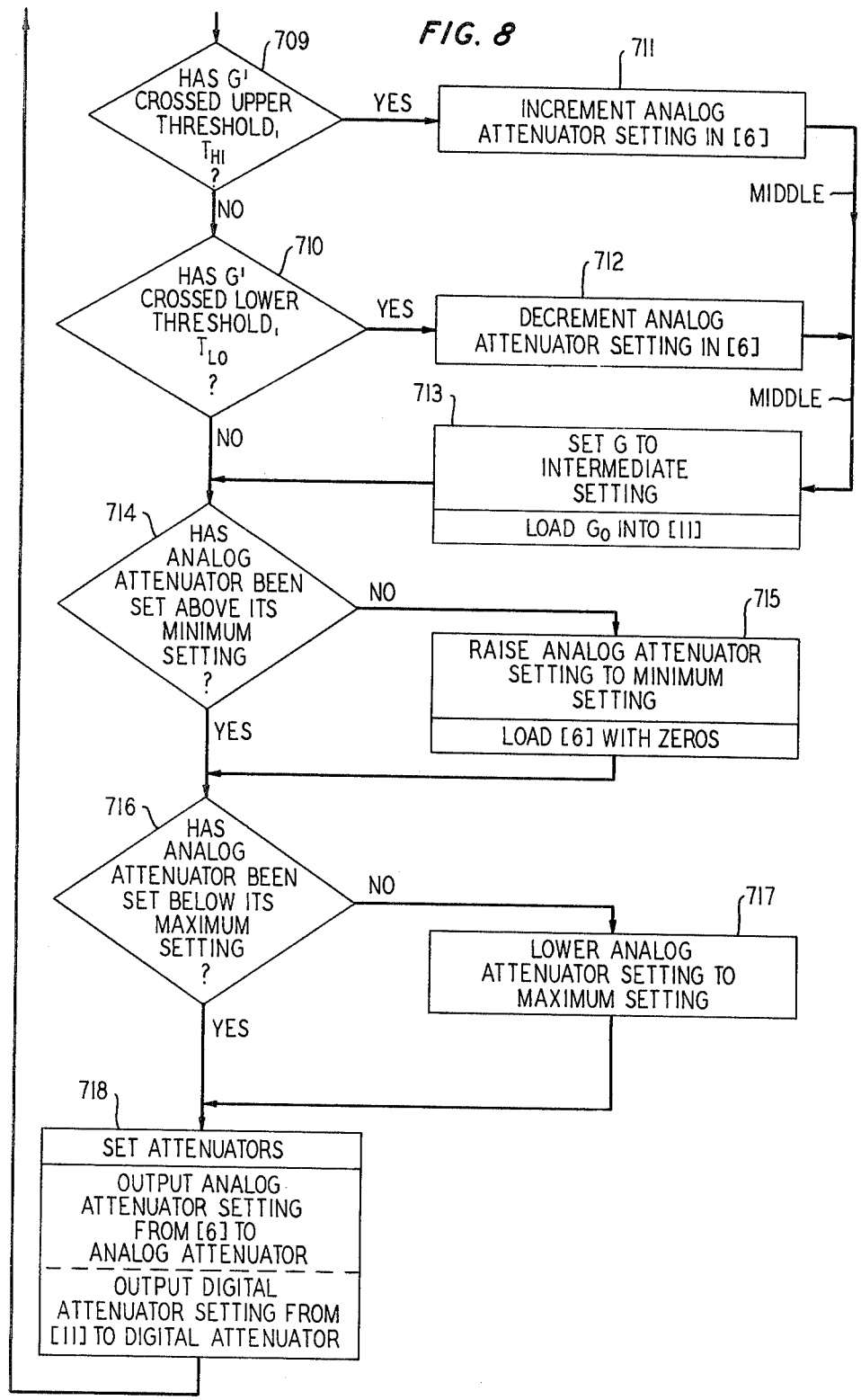

The program listing and, hence, operation of digital control circuit 60' is more readily understood with the aid of the flowchart shown in FIGS. 7 and 8 when combined as indicated in FIG. 9. The flowchart can be seen to include three different symbols. The elongate oval symbol indicates and signifies the beginning of the routine. The rectangular symbols, commonly referred to as operational blocks, contain the description of a particular detailed operational step. The diamond shaped symbols commonly referred to as conditional branch points, contain a description of a test performed by a microcomputer for enabling it to determine the next operation to be performed. Square brackets have been used in FIGS. 7 and 8 and in the Appendix to indicate that the number contained therein refers to the register of the same number in CPU 602.

As shown in FIG. 7, the digital control (DIGCTRL) routine is entered in oval 701. Operational block 702 indicates that digital control circuit 60' is initialized by clearing all working registers in CPU 602, RAM 604, and multiplier 606. Reference signals $P_O$, A' and B are loaded into CPU 602 working registers 5, 4 and 1, respectively. In an example from experimental practice, reference signal $P_O$ is set to −15 dB (octal 0100), reference signal A' is set to 15/16 (octal 3600) and reference signal B is set to 1/32 (octal 0100). Reference signal A' is distinguished from, but related to, reference signal A (FIGS. 1, 3 and 4) in that signal A' is substantially equivalent to signal (1-A). The function previously described in Equation (1) is performed in operational block 707 as:

$$F = \Delta P + (F \cdot A'), \quad 0 < A' < 1. \qquad (5)$$

In the example from experimental practice, there are sufficient data bits available to represent signal A' to within ±LSB (least significant bit) of signal (1−A). Specifically, when represented in the microcomputer system, this difference, ±LSB, is insignificant, i.e., ±1/2048.

Conditional branch point 703 tests to determine whether a new signal has been received by A/D 107 (FIG. 1). The NO test result, indicating that a new signal has not been received, returns control to conditional branch point 703, i.e., START. If a new signal is received, a YES test result occurs and control is transferred to operational block 704. When the new signal is received by A/D 107 it is not converted by A/D 107 until A/D flag in I/O 601 is cleared. This prevents amplitude changes in signal 103 from entering digital attenuator 108 and digital control circuit 60' before digital control circuit 60' has completed responding to the previous amplitude change in signal 103.

Operational block 704 causes signal 104 to be supplied to digital control circuit 60' through I/O 601. A/D flag in I/O 601 is cleared to indicate that A/D 107 may perform the analog-to-digital conversion of signal 102 (FIG. 1). When conversion in A/D 107 is completed, A/D flag in I/O 601 is again set. A/D 107 output signal is attenuated by digital attenuator 108 to produce signal 104. The amplitude of signal 104 is transferred through I/O 601 to registers X and Y in multiplier 606 and to register 10 via bus 607. Control is transferred to operational block 706.

Operational block 706 computes error signal $\Delta P$. Gain adjusted output signal 104 is in registers X and Y from the previous operation in block 704. In this instance, multiplying the contents of register X by the contents of register Y causes gain adjusted output signal 104 to be squared. The square of signal 104 in register P represents the instantaneous power of signal 104. Reference signal $P_O$ in register 5 is subtracted from the contents of register P resulting in error signal $\Delta P$. $\Delta P$ is stored in register 2. Control is transferred to operational block 707.

Operational block 707 causes signal $\Delta P$ to be filtered. Signal F, which is stored in register 3 is loaded into register Y and reference signal A' is loaded into register X. Multiplication of signals F and A' is performed. The product in register P from the multiplication is added to signal $\Delta P$ from register 2 resulting in signal F' as previously shown in Equation (5). Signal F' is then loaded into register Y and stored in register 3. Control is transferred to operational block 708.

Operational block 708 computes attenuator adjustment signal G'. Reference signal B in register 1 is loaded into register X for multiplication with signal F' in register Y. Product signal B·F is then loaded into register X for multiplication with attenuator setting signal G in register Y. The product of the latter multiplication is then subtracted from signal G and the difference, attenuator adjustment signal G', is stored in register 11. Signal G' is substantially equivalent to that shown in Equation (2). Control is transferred to conditional branch point 709.

Conditional branch point 709 tests whether signal G' in register 11 has crossed upper threshold $T_{HI}$. When a NO test result occurs, i.e., the amplitude of signal G' is less than upper threshold $T_{HI}$, control is transferred to conditional branch point 710. In an example from experimental practice, upper threshold $T_{HI}$ is set to one (octal 4000). To test whether signal G' has crossed upper threshold $T_{HI}$ in this example, it is necessary only to observe the condition of the most significant bit (MSB) of signal G' in register 11. If MSB of signal G' is a binary zero, then signal G' has not crossed upper threshold $T_{HI}$. Therefore, signal G' is less than $T_{HI}$ and a NO test result occurs. The YES test result is described below.

Conditional branch point 710 tests whether signal G' in register 11 has crossed lower threshold $T_{LO}$. If the amplitude of signal G' is greater than lower threshold $T_{LO}$, then signal G' has not crossed lower threshold $T_{LO}$. Occurrence of the NO test result causes control to be transferred to conditional branch point 714. In the example, lower threshold $T_{LO}$ is set to a value of ½ (octal 2000). To test whether signal G' has crossed lower threshold $T_{LO}$ in this example, signal G' in register 11 is doubled, i.e., added to itself, and MSB of the sum is tested. If the sum is octal 4000 or greater, then a binary one appears in the MSB position of the sum signifying that signal G' has not crossed lower threshold $T_{LO}$. At this point, the contents of register 11 are no longer called attenuator adjustment signal G' but rather are identified as attenuator setting signal G. The YES test result is described below.

Returning to conditional branch point 709, assume that signal G' in register 11 has crossed upper threshold $T_{HI}$. This condition results when the amplitude of signal G' is greater than or equal to the upper threshold $T_{HI}$ and causes a YES test result to occur. In the example, this occurrence corresponds to a binary one being in the MSB position of signal G' in register 11. Control is transferred to operational block 711.

Operational block 711 causes CPU 602 to increment an analog attenuator setting in register 6. In the example, the analog attenuator setting in register 6 utilizes the three least significant bits of register 6. Incrementing the analog attenuator setting corresponds to decreasing the amount of attenuation applied by analog attenuator 106 as shown in Table I. Control is transferred to operational block 713, i.e., MIDDLE.

Returning to conditional branch point 710, assume that signal G' in register 11 is less than or equal to lower threshold $T_{LO}$. This condition generates a YES test result. In the example, if the sum of signal G' in register 11 with itself produces a binary zero in the MSB position of the sum, then signal G' has crossed lower threshold $T_{LO}$. Control is transferred to operational block 712.

Block 712 causes CPU 602 to decrement the analog attenuator setting in register 6. In the example, decrementing the analog attenuator setting corresponds to increasing the amount of analog attenuation as shown in Table I. Control is transferred to operational block 713, i.e., MIDDLE.

Operational block 713, i.e., MIDDLE, causes register 11 containing signal G' to be set to a predetermined intermediate setting, $G_O$. In an example from experimental practice, $G_O$ is the geometric mean of signals $T_{HI}$ and $T_{LO}$. More particularly, in this example, $G_O$ is approximately $\sqrt{2}/2$, octal 2650, as described earlier. At this point, the contents of register 11 are no longer called attenuator adjustment signal G' but rather are identified as attenuator setting signal G. Control is transferred to conditional branch point 714.

Conditional branch point 714 tests whether the analog attenuator setting in register 6 has been set above a minimum setting. In the example, the minimum analog attenuator setting in register 6 is the all zero word, octal 0000. If, upon entry to conditional branch point 710, the analog attenuator setting in register 6 is octal 0000 and a YES test result occurs, then operational block 712 decrements register 6 to octal 7777. The test at conditional branch point 714 observes the MSB position of register 6. When a binary one occurs in the MSB position of register 6, the analog attenuator setting is below the minimum setting resulting in a NO test result from conditional branch point 714. Control is transferred to operational block 715. The YES test result is discussed below.

Operational block 715 raises the analog attenuator setting in register 6 back to the minimum setting. The minimum analog attenuator setting (octal 0000) is loaded directly into register 6. Control is transferred to conditional branch point 716.

Returning to conditional branch point 714, assume that analog attenuator setting in register 6 is above the minimum setting. This generates a YES test result and control is transferred to conditional branch point 716. In the example, the YES test result occurs when the MSB position of register 6 is set to a zero. This indicates that the analog attenuator setting is above the minimum analog attenuator setting.

Conditional branch point 716 tests whether the analog attenuator setting in register 6 is below a maximum setting. In the example, the maximum analog attenuator setting is octal 0007. Assume that operational block 711 caused the analog attenuator setting in register 6 to be incremented to octal 0010, which is greater than the maximum analog attenuator setting. The test in conditional branch point 716 causes the analog attenuator setting in register 6 to be subtracted from the maximum analog attenuator setting (octal 0007) with the difference stored in register 7. If the difference in register 7 is a negative number, i.e., the MSB position of register 7 is a binary one, then the analog attenuator setting has not been set below the maximum setting. In this example, the difference stored in register 7 is octal 7777, a negative number. The MSB position contains a binary 1 causing a NO test result to occur. Control is transferred to operational block 717. The YES test result is explained below.

Operational block 717 lowers the analog attenuator setting in register 6 to the maximum analog attenuator setting. In the example, operational block 717 causes the difference in register 7 to be added to the analog attenuator setting in register 6. Control is then transferred to operational block 718.

Returning to conditional branch point 716, assume that the analog attenuator setting in register 6 is below the maximum analog attenuator setting. In the example, if the subtraction of the contents of register 6 from the maximum analog attenuator setting produces a positive difference, i.e., MSB is a binary zero, and a YES test result occurs. Control is transferred to operational block 718.

Operational block 718 causes the analog attenuator setting in register 6 to be supplied to analog attenuator 106 (FIG. 1) through I/O 601 and digital control circuit 60' output. This signal is analog attenuator setting signal 105. Also, the digital attenuator setting in register 11 is supplied to digital attenuator 108 through I/O 601 and digital control circuit 60'. This signal is digital attenuator setting signal, G. Control is transferred to conditional branch point 703, i.e., START.

Digital attenuator 108 (FIG. 1) may be incorporated into digital control circuit 60'. Briefly, the modifications would require operational block 705 (not shown) to be inserted between operational blocks 704 and 706 with the appropriate control transfers to accommodate this insertion. Also, signal 103 is supplied through I/O 601 to only register X and signal 104 is supplied from I/O 601.

Operational block 705 applies the digital attenuation to signal 103 (FIG. 1) stored in register X. Signal G stored in register 11 is loaded into register Y of multiplier 606 and multiplication of the contents of multiplier registers X and Y is performed. Gain adjusted output signal 104 is the product of this multiplication and is stored in register P. The contents of register P are transferred to I/O 601 for supplying gain adjusted output signal 104 from digital control circuit 60' and the digital AGC (FIG. 1). Additionally, the contents of register P are stored in register 10 for future use. Control is transferred to operational block 706.

The above described insertion of operational block 705 causes a modification to block 706. Simply stated, signal 104 is loaded from register P into registers X and Y.

Reference signals $P_O$, $G_O$, A, A', B and threshold limit signals $T_{HI}$ and $T_{LO}$ in FIGS. 1 through 6 are variable as previously described. In operation of the digital AGC, these signals do not change. However, applications arise wherein dynamically adaptive variations of these signals are desirable. For instance, during the initialization of the digital AGC it is desirable to have the digital AGC adjust more rapidly to bring received signal 101 to the correct level before the onset of the information bearing part of signal 101. On the other hand, once the digital AGC is in a steady state mode, the digital AGC should not track the short term fluctuations introduced by the carrier of received signal 101. Rather, the digital AGC should track fluctuations introduced by the transmission medium. Reference signal B, the time constant for filter 411, (FIG. 4) controls the speed at which the digital AGC adjusts to signal 101. For example, by setting signal B to 1/16 the digital AGC reacts rapidly to short term fluctuations. When signal B is set to a much lower setting (1/128), the digital AGC reaction is retarded. This is desirable in steady state operation.

Digital control circuit 60 (FIG. 3) and digital control circuit 60' (FIG. 6) are used interchangeably in the digital AGC arrangement in FIG. 1. Because of the unique method of attenuation control provided by digital control circuits (60, 60'), analog attenuator 106 is not required to be a high precision attenuation network. Certain design considerations are employed to relax the precision of analog attenuator 106. The resulting lack of precision of analog attenuator 106 does not affect the digital AGC operation. Digital control circuit 60 continuously adjusts the attenuation setting of digital attenuator 108 and such adjustment overcomes imprecision in the realization of an analog attenuator 106.

APPENDIX

```
**DIGCTRL
LDIM 0100,D0,OR,,B = F,,05         LOAD 0100 (1/32) INTO [05] (P0)
LDIM 0100,D0,OR,,B = F,,01         LOAD 0100 (1/32) INTO [01] (B)
LDIM 3600,D0,OR,,B = F,,04         LOAD 3600 (15/16) INTO [04] (A')
START: CONT
JC F1 START                        IF FLAG 1 (A/D FLAG) IS NOT SET GO BACK TO START
CONT,,,,,,1,,,FLG                  CLEAR A/D FLAG
CONT,D0,OR,,B = F,,10,DA,,,OUT     OUTPUT OF DIGITAL ATTENUATOR LOADED INTO
                                   MULTIPLIER X AND Y INPUTS AND TO [10].
                                   AFTER THIS THE OUTPUT OF THE MULTIPLIER WILL
                                   BE (DIGITAL ATTENUATOR OUTPUT SIGNAL SQUARED) = P.
CONT
CONT,DA,SUBS,,B = F,05,02,HMLT     P − P0 = ΔP TO [02]
CONT,0A,OR,,,03,,,,CSTRO           CONTENTS OF [03] (F) TO CSTRO
CONT,0A,OR,,,04,,,,,OUT,CSTRO      CONTENTS OF [04] (A') TO MULTIPLIER X INPUT,
                                   CSTRO TO MULTIPLIER Y INPUT
CONT
CONT,DA,OR,,B = F,02,03,HMLT,,CSTRO  MULTIPLIER OUTPUT + CONTENTS OF [02] (ΔP) TO
                                     [03] AND CSTRO
                                     THIS IS THE NEW VALUE OF F.
CONT,0A,OR,,,01,,,,,OUT,CSTRO      CONTENTS OF [01] (B) TO MULTIPLIER X INPUT,
                                   CSTRO TO MULTIPLIER Y INPUT
CONT,0A,OR,,,11,,,,CSTRO           CONTENTS OF [11] (G') TO CSTRO
CONT,D0,OR,,,,,HMLT,,,OUT,CSTRO    MULTIPLIER OUTPUT (B . F) TO MULTIPLIER X INPUT,
                                   CSTRO TO MULTIPLIER Y INPUT
CONT
CONT,DA,SUBR,,B = F,11,11,HMLT     (G') - MULTIPLIER OUTPUT TO [11]
                                   AT THIS POINT G'HAS BEEN REPLACED BY G(1-BF)
JC F17X                            IF THE SIGN BIT IS ZERO, GO TO X.
                                   OTHERWISE,
CONT,0A,ADD,1,B = F,06,06          INCREMENT [06]
JP MIDDLE                          JUMP TO "MIDDLE"
X: CONT,AB,ADD,,,11,11             ADD [11] TO [11] (DOUBLE CONTENTS OF [11])
JC T17 Y                           IF THE MSB IS ONE (I.E. G' IS GREATER THAN ½)
                                   GO TO Y
CONT,0A,SUBR,0,B = F,06,06         DECREMENT [06]
MIDDLE: CONT
LDIM 2650 D0,OR,,B = F,,11         SET [11] (G) TO √2/2
                                   THE CONTENTS OF [11] AREA NOW IDENTIFIELD AS G.
Y:CONT,0A,ADD,,,06                 LOOK AT [06]
JC F17 Z                           IF MSB IS ZERO (I.E. [06] IS POSITIVE) JUMP TO Z
CONT,0A, AND,,B = F,06,06          SET [06] EQUAL TO ZERO
Z: CONT
LDIM 0007 DA,SUBS,1,B = F,06,07    SUBTRACT [06] FROM 0007 AND LOAD INTO [07]
JC F17 W                           IF [07] IS POSITIVE JUMP TO W
CONT,AB,ADD,,B = F,07,06           ADD [07] TO [06] AND PUT IN [06]
W: CONT,0A,ADD,,,06,,,,AATT        LOAD CONTENTS OF [06] INTO ANALOG ATTENUATOR
```

| APPENDIX-continued | |
|---|---|
| CONT,0A,ADD,,,11,,,,DATT | LOAD CONTENTS OF [11] INTO DIGITAL ATTENUATOR |
| JP START | JUMP BACK TO START. |

I claim:

1. Digital automatic gain control apparatus of the type including a first variable attenuator (106, 107) responsive to a first control signal (105) for applying controlled attenuation to an analog input signal (101) and a second variable attenuator (108) for applying controlled attenuation to a digital representation (103) of an output signal from the first attenuator (106, 107) to generate a gain adjusted output signal (104), digital control means (60) responsive to the gain adjusted output signal (104) for generating the first control signal (105) and for generating a second control signal (G) to cause incremental adjustment of the attenuation applied by the second attenuator (108) when the first control signal (105) maintains the attenuation applied by the first attenuator (106, 107) nominally constant and to cause a substantial adjustment of the attenuation applied by the second attenuator (108) to a prescribed intermediate setting ($G_0$) between predetermined maximum and minimum attenuation settings ($T_{HI}, T_{LO}$) for the second attenuator (108) counteracting the simultaneous attenuation adjustment of the first attenuator (106, 107).

2. The apparatus defined in claim 1 wherein the digital control means (60) generates the first and second control signals (105, G) for adjusting the attenuation applied by the first and second attenuators (106, 107 and 108) respectively by: filtering the gain adjusted output signal (104) from the second attenuator (108) to generate an adjustment signal (G') representing the incremental attenuation adjustment of the second attenuator (108); comparing the adjustment signal (G') with the predetermined maximum and minimum attenuation settings ($T_{HI}, T_{LO}$) to determine whether the adjustment signal (G') is within a range of adjustment signal amplitudes between the maximum and minimum attenuation settings ($T_{HI}, T_{LO}$); adjusting the second attenuator (108) to an attenuation setting prescribed by the adjustment signal (G') when the adjustment signal (G') is within the range of adjustment signal amplitudes; and adjusting the second attenuator (108) to the prescribed intermediate attenuation setting ($G_O$) and simultaneously adjusting the first attenuator (106, 107) when the adjustment signal (G') is outside the range of adjustment signal amplitudes.

3. The apparatus defined in claims 1 or 2 wherein the prescribed intermediate attenuation setting ($G_O$) of the second attenuator (108) is substantially equal to the geometric mean of the predetermined maximum and minimum attenuation settings ($T_{HI}, T_{LO}$) of the second attenuator (108).

4. The apparatus defined in claim 1 wherein the digital control means (60) includes means (40) responsive to the gain adjusted output signal (104) and to the second control signal (G) for controllably filtering the gain adjusted output signal (104) to generate an attenuator adjustment signal (G'), a threshold detector (31) responsive to the attenuator adjustment signal (G') for generating a plurality of attenuation control signals (HI, LO) to indicate whether the attenuator adjustment signal (G') is within or without a range of attenuator adjustment signal amplitudes between the predetermined maximum and minimum attenuation settings ($T_{HI}, T_{LO}$), means (32) responsive to the plurality of attenuation control signals (HI, LO) for generating the first control signal (105) to adjust the attenuation applied by the first attenuator (106, 107), and means (50) responsive to the plurality of attenuation control signals (HI, LO) and to the attenuator adjustment signal (G') for generating the second control signal (G) to adjust the attenuation applied by the second attenuator (108).

5. The apparatus defined in claim 4 wherein the means (40) for generating the attenuator adjustment signal (G') includes means (401) for generating an error signal ($\Delta P$) representing a disparity between common characteristics of the gain adjusted output signal (104) and a supplied signal ($P_O$), and a plurality of filter means (410, 411) in serial circuit relation and being responsive to the error signal ($\Delta P$) for generating the attenuator adjustment signal (G').

6. The apparatus defined in claim 5 wherein the means (50) for generating the second control signal (G) includes OR gate means (501) for detecting signal activity among the plurality of attenuation control signals (HI, LO), and controllable storage register means (502) for storing one of a plurality of input signals (G',$G_O$) in response to a predetermined output signal (503) from the OR gate means (501) and for generating the second control signal (G).

7. The apparatus defined in claim 1 wherein the digital control means (60) includes computer means (60').

8. The apparatus defined in claim 7 wherein the computer means (60') includes central processor means (602) having a plurality of working registers, multiplier means (606), clock means (603) for supplying timing signals to the central processor means (602) and to the multiplier means (606), read/write memory means (604) having at least first and second registers, read-only memory means (605), and input/output means (601).

9. The apparatus defined in claim 8 wherein a set of instructions is stored in the read-only memory means (605) for causing the computer means (60') to generate first and second control signals (105, G) for adjusting the attenuation applied by the first and second attenuator (106, 107 and 108) respectively: filtering the gain adjusted output signal (104) from the second attenuator (108) to generate an adjustment signal (G') representing the incremental attenuation adjustment of the second attenuator (108); comparing the adjustment signal (G') with the predetermined maximum and minimum attenuation settings ($T_{HI}, T_{LO}$) to determine whether the adjustment signal (G') is within a range of adjustment signal amplitudes between the maximum and minimum attenuation settings ($T_{HI}, T_{LO}$); adjusting the second attenuator (108) to an attenuation setting prescribed by the adjustment signal (G') when the adjustment signal (G') is within the range of adjustment signal amplitudes; and adjusting the second attenuator (108) to the prescribed intermediate attenuation setting ($G_O$) and simultaneously adjusting the first attenuator (106, 107) when the adjustment signal (G') is outside the range of adjustment signal amplitudes.

10. The apparatus defined in claim 8 wherein a set of instructions is stored in the read-only memory means (605) for causing the computer means (60') to generate first and second control signals (105, G) for adjusting the attenuation applied by the first and second attenuators (105, 107 and 108) respectively by: first (702), initializing the digital control means (60); second (702), clearing the working registers; third (702), presetting a plurality of reference signals ($P_O$, A',B) to predetermined levels; fourth (703), testing an output signal (103) from the first attenuator (106, 107) to determine whether a signal (101) has been received; fifth (703, NO), if the test result in step fourth (703) is NO, returning to step fourth (703); sixth (703, YES), if the test result in step fourth (703) is YES, proceeding to step seventh (704); seventh (704), loading the gain adjusted output signal (104) from the second attenuator (108) into a working register; eighth (706, 707, 708), successively filtering the gain adjusted output signal (104) in at least a first (706, 707) and second (708) filter to generate the attenuator adjustment signal (G'); ninth (709), testing whether the attenuator adjustment signal (G') has increased above the maximum attenuation setting ($T_{HI}$); tenth (709, NO), if the test result in step ninth (709) is NO, proceeding to step eleventh (710); eleventh (710), testing whether the attenuator adjustment signal (G') has decreased below the minimum attenuation setting ($T_{LO}$); twelfth (710, NO), if the test result in step eleventh (710) is NO, proceeding to step sixteenth (714); thirteenth (711), if the test result in step ninth (709) is YES, increasing the attenuation setting of the first attenuator (106, 107) stored in a working register and proceeding to step fifteenth (713); fourteenth (712), if the test result in step eleventh (710) is YES, decreasing the attenuation setting of the first attenuator (106, 107) stored in a working register and proceeding to step fifteenth (713); fifteenth (713), setting attenuator adjustment signal (G') in a working register to the prescribed intermediate setting ($G_O$); sixteenth (714), testing whether the attenuation setting of the first attenuator (106, 107) stored in a working register has been set above a minimum attenuation setting for the first attenuator (106, 107); seventeenth (714, YES), if the test result in step sixteenth (714) is YES, proceeding to step nineteenth (716); eighteenth (715), if the test result in step sixteenth (714) is NO, increasing the attenuation setting of the first attenuator (106, 107) to the minimum attenuation setting of the first attenuator (106, 107); nineteenth (716), testing whether the attenuation setting of the first attenuator (106, 107) has been set below a maximum setting for the first attenuator (106, 107); twentieth (716, YES), if the test result in step nineteenth (716) is YES, proceeding to step twenth-second (718); twenty-first (717), if the test result in step nineteenth (716) is NO, decreasing the attenuation setting of the first attenuator (106, 107) to the maximum setting for first attenuator (106, 107); twenty-second (718), outputting the first control signal (105) from a working register through input/output means (601) to the first attenuator (106, 107); twenty-third (718), outputting the second control signal (G) from a working register containing the attenuator adjustment signal (G') as set prior to step sixteenth (714) through input/output means (601) to the second attenuator (108); twenty-fourth (START), returning to step fourth (703).

* * * * *